(12) United States Patent
Shih et al.

(10) Patent No.: US 9,472,279 B2
(45) Date of Patent: Oct. 18, 2016

(54) MEMORY CELL DYNAMIC GROUPING USING WRITE DETECTION

(71) Applicant: Taiwan Semiconductor Manufacturing Company Limited, Hsinchu (TW)

(72) Inventors: Yi-Chun Shih, Taipei (TW); Farid Nemati, San Jose, CA (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 4 days.

(21) Appl. No.: 14/600,128

(22) Filed: Jan. 20, 2015

(65) Prior Publication Data

US 2016/0211018 A1 Jul. 21, 2016

(51) Int. Cl.
*G11C 13/00* (2006.01)

(52) U.S. Cl.
CPC ....... *G11C 13/0069* (2013.01); *G11C 13/0038* (2013.01)

(58) Field of Classification Search
CPC .................. G11C 13/0038; G11C 13/0069
See application file for complete search history.

(56) References Cited

U.S. PATENT DOCUMENTS

| 7,062,599 B2 * | 6/2006 | Pistilli | G11C 16/10 711/103 |
| 7,224,617 B2 * | 5/2007 | Takeuchi | G11C 8/08 365/185.12 |
| 2005/0207229 A1 * | 9/2005 | Takeuchi | G11C 8/08 365/185.25 |
| 2010/0202194 A1 * | 8/2010 | Confalonieri | G11C 8/12 365/163 |
| 2013/0007354 A1 * | 1/2013 | Shiiba | G06F 12/0246 711/103 |

* cited by examiner

*Primary Examiner* — Harry W Byrne
*Assistant Examiner* — R Lance Reidlinger
(74) *Attorney, Agent, or Firm* — Jones Day

(57) ABSTRACT

A memory system and dynamic memory cell programming process thereof is disclosed. The dynamic programming processes comprises the processes of: (a) determining a concurrent-programmable bit number in accordance with a current budget limit; (b) identifying, with a memory controller, a memory cell in a plurality of memory cells in need of programming; (c) performing programming operation on at least one of the memory cells in need of programming; (d) detecting, with a write-detection unit, an programming operation status of the memory cell being programmed and correspondingly generating a program completion indication; and (e) triggering programming operation to a subsequent one of the memory cells according to the program completion indication from the write-detection unit.

20 Claims, 9 Drawing Sheets

MEMORY CELL DYNAMIC GROUPING USING WRITE DETECTION

TECHNICAL FIELD

The present invention relates generally to memory devices, and, more particularly, to systems and techniques for programming non-volatile memory devices capable of exhibiting different resistivity states for storing data.

BACKGROUND

Unlike a capacitor memory device in which memory characteristics are proportional to the size of a cell area, the resistive type memory devices require noticeably less area budget, and therefore are capable of achieving significantly higher level of integration.

However, while the write speed of these highly integratable memory cells are theoretically identical, the reality is that some memory cells are programmed or erased faster than others, resulting in a distribution of threshold voltage for each state. Conventional solution is to group the memory bits in small numbers and provide fixed program pulses separately with write-verifications in between. However, the fixed program pulse in such a scheme is required to match the memory cell of a fastest reaction time, while the cumulative program pulse duration need to match the memory cell of a slowest reaction time, thereby inevitably sacrificing overall programming throughput.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
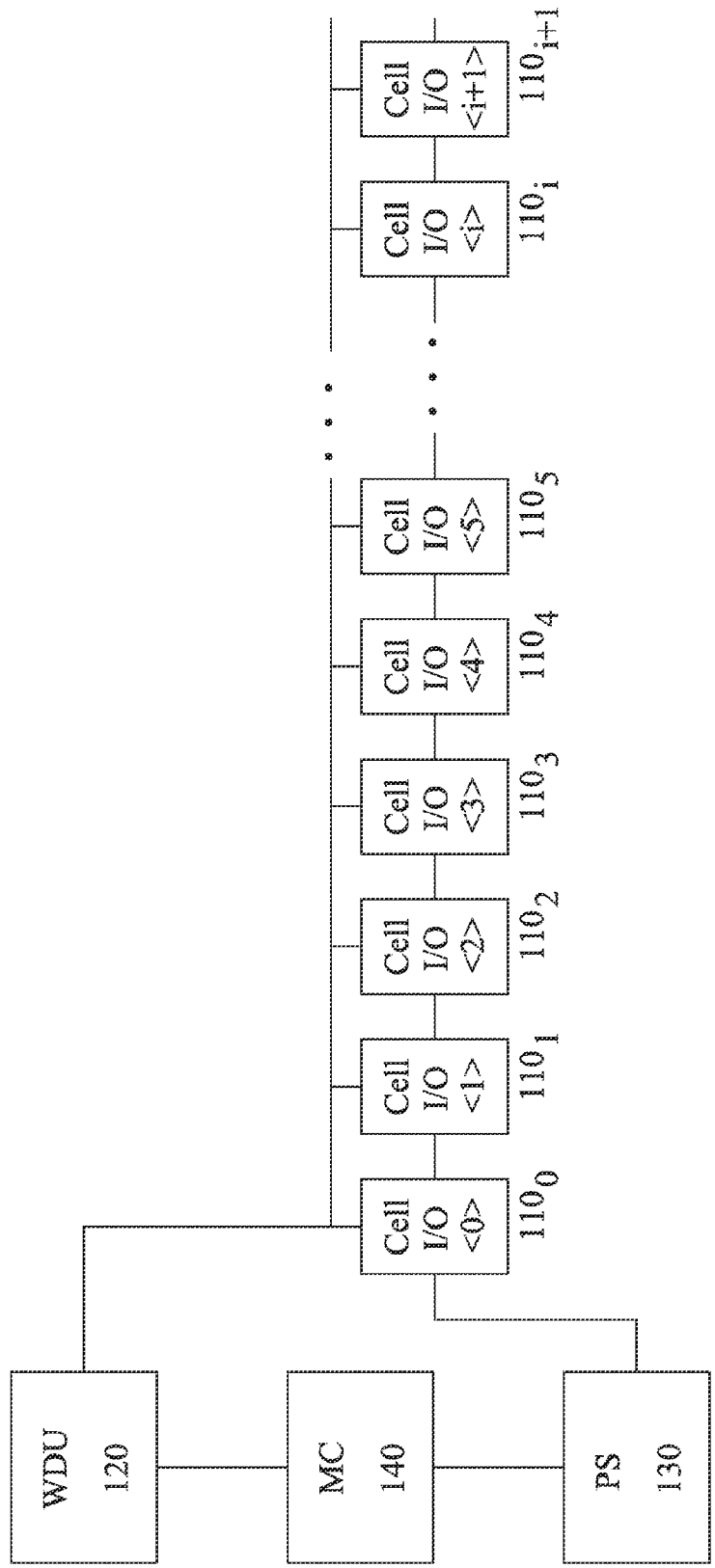
FIG. 1 shows a block diagram of a memory system in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Non-volatile memory devices are characterized in that there is no loss of data stored in the memory cells even when external power supply is absent. Therefore, once data is recorded (programmed) in a memory cell thereof, no additional power would be required to maintain the stored information during, or even after the operation of the non-volatile memory device. This beneficial attribute makes non-volatile memory devices particularly favorable in applications that requires a conscious usage of limited power source, such as in mobile computing devices, mobile communication systems, portable memory cards, and the like.

A flash memory device is a type of non-volatile memory device currently in widespread employment. The flash memory device typically utilizes memory cells having a stacked floating gate structure. However, the programming speed and the number of write cycles of a flash memory device are inherently limited.

Researches on new non-volatile memory devices as the flash memory replacement have been actively on-going. A new class of non-volatile memory device based on magnetic and/or glass-based materials, which displays reversibly-varying resistive characteristics by applied electric pulses for a data storage material layer, has demonstrate promising potential for future integration applications.

One such non-volatile memory device is a phase change memory (PC-RAM) device, which employs a phase change material layer that is reversibly variable between an amorphous state and a crystalline structure by applied electric pulses. The phase-change material of the PC-RAM exhibits a relatively low resistance in its crystalline state, and a relatively high resistance in its amorphous state. In conventional nomenclature, the low-resistance crystalline state is referred to as a 'set' state and is designated logic "0", while the high-resistance amorphous state is referred to as a 'reset' state and is designated logic "1".

A resistance random access memory (RRAM) device has also been recently introduced, in which a variable resistive material layer is used as a data storage material layer. The variable resistive material layer is a material layer characterized to show reversible resistance variance in accordance with a polarity and/or an amplitude of an applied electric pulse, and a colossal magneto-resistive material layer (CMR material layer) having a perovskite structure, for example, PrCaMnO$_3$ (PCMO) layer is normally used. In the meantime, a transition metal oxide layer is studied as a replaceable material instead of the PCMO layer because the transition metal oxide layer may be more easily deposited and patterned in the typical semiconductor fabrication processes.

Unlike a capacitor memory device in which memory characteristics are proportional to the size of a cell area, the resistive type memory devices require noticeably less area budget, and are capable of achieving significantly higher level of integration, even in a three dimensional stacked fashion.

As with other types of semiconductor memories, efforts are made to reduce the level of supply voltage for driving the resistive type memory devices. However, the reduction in supply voltage often makes it difficult to generate sufficient write currents to reliably program the state of the resistance-varying materials. Further, in the case of low level supply voltages, the selection of memory cells can become problematic due to voltage drops caused by parasitic resistance between the power supply voltage and the resistive memory cells.

As such, it may become necessary to rely on voltage boosting circuits such as a charge pump for generating write currents of sufficient magnitude to program a resistive type memory device. In many cases, a boosted voltage is utilized to drive portions of the resistive type memory device. However, the scarcity of area budget in a highly integrated device often posts limitations to the output capability of a charge pump, which in turn limits the number of bits that can be programmed simultaneously. On the other hand, due to extremely small size of components making up the memory device, excess exposure to boosted voltages can adversely affect the overall reliability of the resistive type memory device.

Moreover, although the write time of each state is in theory the same for all memory cells, the reality is that some memory cells are programmed or erased faster than others, resulting in a distribution of threshold voltage for each state. The conventional solution is to group the memory bits in small numbers and provide fixed program pulses separately. However, the fixed program pulse in such a scheme is required to match the memory cell of a slowest reaction time, thus inevitably sacrificing overall programming throughput.

Referring to FIG. 1, which shows a block diagram of a memory system in accordance with some embodiments of the instant disclosure. Specifically, the memory system of the instant embodiment includes a plurality of memory cells (e.g., cells $110_0$-$110_i$, etc., each having a corresponding I/O <0>-I/O <i>, etc.); a write detection unit (WDU) 120 in connection with the memory cells $110_0$-$110_i$ and capable of detecting a programming operation status thereof; a power source (PS) 130 in connection with the memory cells $110_0$-$110_i$ and configured to provide a memory cell programming pulse (e.g., an electrical voltage/current); and a memory controller (MC) 140 in connection with the write detection unit 120 and the power source 130, and is capable of controlling a memory access action (e.g., program/reset/read/write operations) of the memory cells $110_0$-$110_i$.

The memory cells $110_0$-$110_i$ may include non-volatile, resistive type memory devices. The memory device generally comprises a memory material having reversibly varying resistance (while other types of memory cells, such as flash memory, may also be utilized). The resistance characteristics of the memory material may vary between a high resistance state (i.e., HRS) and a low resistance state (LRS) in accordance with the application of an externally applied electrical programming signal (e.g., electrical voltage/current). In some applications, more subtle increments of resistive states may be defined between the HRS and the LRS. The distinct resistance states of the memory material are utilized to indicate binary data bits (e.g., 0 and 1), thereby providing the capability of data storage.

The write detection unit 120 may include standard complementary metal oxide semiconductor (CMOS) electronics designed to interface with the memory cells $110_0$-$110_i$ and sense the variation of the resistive characteristics thereof upon the application of electrical stimulations (e.g., set/reset current/voltage). Moreover, the write detection unit 120 is configured to detect a programming operation status of the memory cells being programmed. For instance, the write detection unit 120 may include a circuit designed to monitor a status of an electrical stimulation in a memory cell during a cell access operation (such as a cell current/voltage), compare the detected status with a predetermined threshold value, and correspondingly generating a program completion indication indicative of the completion of a programming process to a particular memory cell.

The memory controller 140 may be connected to outside electronic circuits (not shown) such as processors, communication equipment, and/or other circuits that may require a memory circuit in various applications. The memory controller 140 may be configured to interact with external circuits to receive/ transmit requests, acknowledgements, busy status, data, and control signals. The memory controller 140 may control the read and write actions for the memory cells $110_0$-$110_i$. Moreover, the memory controller 140 is configured to trigger a programming operation of a memory cell according to the program completion indication of the write detection unit 120.

The power source 130 may include, or be in connect with, a power supply unit (not explicitly shown) on or off-board of the memory device. In some applications where a reduced level of supply voltage is desired for overall power conservation purposes, the power source 130 may include a charge pump. The charge pump may comprise voltage/current boosting circuits capable of boosting an electrical stimulus from the low level power supply to a sufficient level for reliably programming a memory cell. In some embodiments, the power source 130 is configured to provide a program current budget sufficient to concurrently support the programming processes of a particular number of memory cells. For instance, the program current budget defines a limit for the number of memory cells that can be reliably programmed upon the generation of electrical stimulation by the power source 130. In some embodiments, the power source 130 is configured to operate continuously and provide substantially constant output until the programming operations of all the memory cells in a cell group are complete.

Particularly, the program current budget may reflect a physical capability of the of the power source 130. Accordingly, the program current budget may correspond to a concurrent-programmable bit number ($N_O$), which represents the number of memory cells concurrently programmable by the output of the power source 130. The concurrent-programmable bit number ($N_0$) typically comprises a positive integer not less than 1.

The exemplary memory system in accordance with the instant disclosure uses an operation status result (of a memory cell) obtained by the write detection unit 120 to dynamically trigger the programming operation of a next memory cell, thereby increasing programming throughput by saving time on the fast responding bits.

Figure 2:
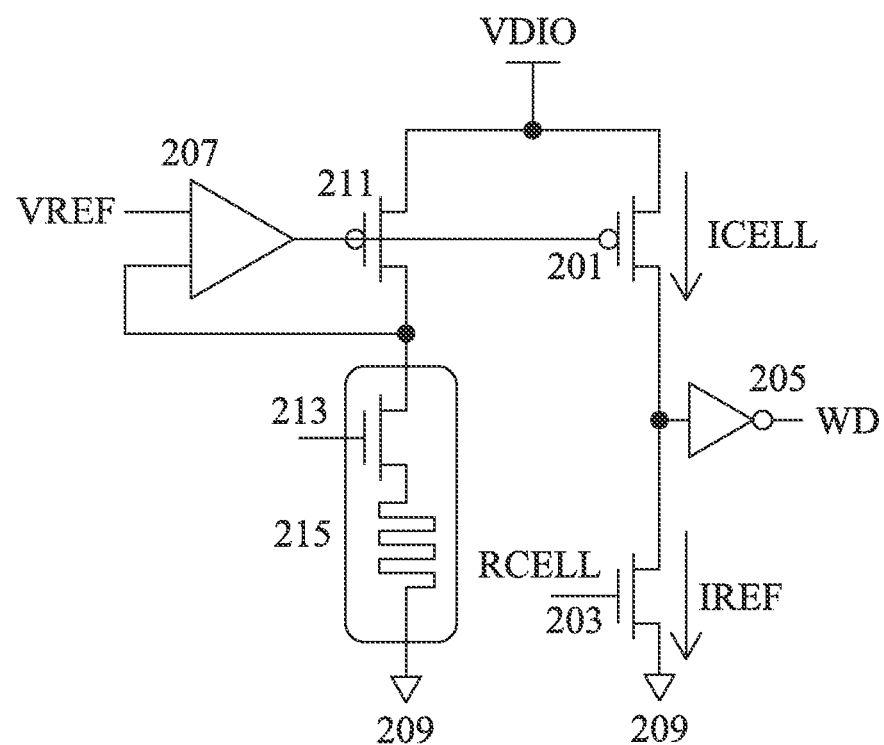
FIG. 2 shows an arrangement of a write detection unit in accordance with some embodiments of the instant disclosure.

Referring to FIG. 2, which shows an arrangement of a write detection unit in accordance with some embodiments of the instant disclosure. The write detection arrangement illustrated in FIG. 2 may be utilized in the write detection unit 120 as shown in the embodiment depicted by FIG. 1.

The write detection unit includes a memory cell portion (on the lower left) connected in parallel with a mirroring portion (on the right) between an I/O voltage supply (VDIO) and a ground 209. The memory cell is typically a non-volatile resistive type memory cell, which may include a transmission gate 211, an access transistor 213, and a resistive varying element 215 connected in series. The mirroring portion includes a first transistor 201, a second transistor 203, and an inverter 205 connect in between. The write detection unit further comprises an operational amplifier 207 having one of the input terminals connected between the transmission gate 211 and the access transistor 213 for establishing a mirroring point of the memory cell voltage. The other input terminal of the operational amplifier 207 is connected to a reference voltage (VREF), while the output terminal thereof is connected to the gate nodes of the transmission gate 211 and the first transistor 201.

In operation, the first transistor 201 experiences a mirroring current (ICELL) that mirrors the in current through the memory cell, while the second transistor 203 experiences a reference current (IREF) there-through. The mirroring current (ICELL) may therefore be compared to the reference current (IREF) for determining an operation status of the memory cell. For example, the reference current (IREF) may be set to indicate a programming operation threshold; a completion of a cell programming operation may be indicated once the mirroring current (ICELL) reached substantially the same level as the programming threshold (e.g., IREF). The inverter 205 is then used to digitize the write detection result to generate a write detection indication (e.g., WD). Accordingly, the cell current (ICELL) is mirrored and compared to a reference current (IREF). Once a write completion indication is detected, the system may turn off the write voltage to conserve power and protect the memory cell from being over stressed.

Figure 3:
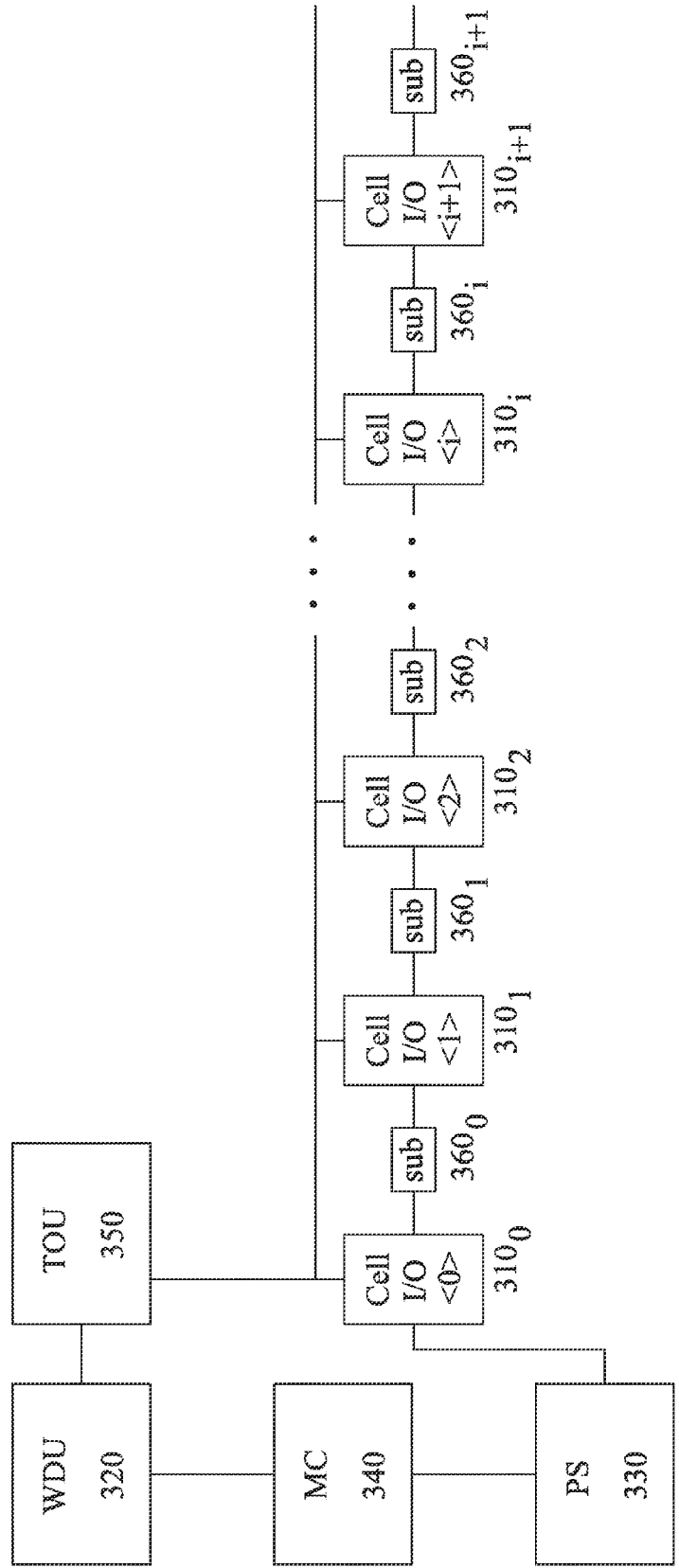
FIG. 3 shows a block diagram of a memory system in accordance with some embodiments of the instant disclosure.

Referring to FIG. 3, which shows a block diagram of a memory system in accordance with some embodiments of the instant disclosure. Specifically, the memory system of the instant embodiment further incorporates a cascaded digital subtractor (sub) and time-out unit (TOU) arrangement.

Specifically, the memory system of the instant embodiment includes a plurality of memory cells (e.g., cells $310_0$-$310_i$, etc., each having an corresponding I/O <0>-I/O <i>, etc.); a write detection unit (WDU) 320 in connection with the memory cells $310_0$-$310_i$ and capable of detecting a programming operation status thereof; a power source (PS) 330 in connection with the memory cells $310_0$-$310_i$ and configured to provide a memory cell programming signal (e.g., an electrical voltage/current) to the memory cells $310_0$-$310_i$; a time-out unit 350 configured to terminate a programming operation to a memory cell upon the lapse of a predetermined period of time; and a memory controller (MC) 340 in connection with the write detection unit 320, the power source 330, and the time-out unit 350, capable of controlling a memory access action (e.g., program/reset/read/write operations) of a memory cell. Moreover, each of the memory cells $310_0$-$310_i$ is provided with a subtractor (e.g., subtractor $360_0$-$360_i$, etc.) in a cascaded fashion.

The memory cells $310_0$-$310_i$, the write detection unit 320, the power source 330, and the memory controller 340 may be substantially identical to that depicted in the previous example, and therefore will not be further discussed for the brevity of disclosure.

The time-out unit 350 is signal communicatively coupled to the memory controller 340 as well as the memory cells $310_0$-$310_i$, and is configured to terminate programming operation to a memory cell upon a predetermined period of time. In some embodiments, each memory cell is provided with a separate time-out unit configured to detect the time-out of each respective memory cell. In practice, the time-out unit 340 may comprise in-memory cell and/or out-of-memory cell circuit components arranged to monitor a time duration of a programming operation, and accordingly provide a time-out indication to the memory controller 340 upon the lapse of a predetermined time period, so that the system may terminate a programming operation to a particular memory cell (usually a faulty or a slow cell) to maintain the operational efficiency thereof by not wasting additional programming time and resources to a non-responsive memory cell. In addition, the time-out unit 340 may prevent over-stressing of a slow-reacting bit/memory cell.

The memory system of the instant embodiment further comprises a subtractor (e.g., subtractor $360_0$-$360_i$) coupled to a respective memory cell (e.g., cells $310_0$-$310_i$). As discussed previously, the power source 330 is configured to provide a program current budget sufficient to concurrently power the programming processes of a particular number of memory cells. Accordingly, the program current budget defines a limit for the number of memory cells that can be reliably programmed by the output of the power source 330.

The program current budget of the power source 330, which reflects a concurrent-programmable bit number ($N_0$), represents the number of memory cells that can be concurrently programmed by the output of the power source 330. Because the output of the power source 330 is typically limited (as the size of the power source 330 is kept low to conserve area budget and reduce power consumption), the available power of the programming output is generally sufficient to power only a predetermined number (e.g., $N_0$) of memory cells at a given time. The concurrent-programmable bit number ($N_0$) typically comprises a positive integer greater than 1 (or at the very least, equal to 1), and the number of memory cells (e.g., the number i of memory cell $310_i$) is greater than the number $N_0$. The information of the concurrently-programmable bit number ($N_0$) is passed to the memory cells (e.g., $310_{i+1}$) as the programming output is provided thereto by the power source 330.

The subtractors (e.g., $360_0$-$360_i$) are provided to process the concurrent-programmable bit number ($N_0$) as the programming output from the power source 330 is sent to the memory cells $310_0$-$310_i$. Specifically, as programming output is provided from the power source 330 to the memory cells (e.g., cells $310_0$-$310_i$), an initial $N_0$ number of memory cells (e.g., cells $310_1$ to $310_{N0}$) in need of programming may be powered to perform programming operation. Accordingly, the subtractor (e.g., $360_0$-$360_{N0}$) of the corresponding memory cells $310_0$-$310_{N0}$ (i.e., the first $N_0$ number of memory cells being programmed) each subtracts a value 1 from the concurrent-programmable bit number ($N_0$), yielding a remaining available bit number ($N_i$, i=1, 2, 3, etc.) for a subsequent memory cell.

In one exemplary embodiment, the concurrent-programmable bit number equals 3. Accordingly, each memory cell $310_0$-$310_i$ receives a remaining available bit number (Ni) from a previous memory cell. For example, the first memory cell $310_0$ receives an initial remaining available bit number $N_0$=3. If memory cell $310_0$ is deemed to be in need of programming, it will use the available power output of the power source 330 to perform the cell programming operation. During the programming operation process of the memory cell $310_0$, the corresponding subtractor $360_0$ subtracts a value 1 from the remaining available bit number for the first cell $310_0$ (in this case, $N_0$−1=2) and passes this information to the subsequent cell $310_1$. Likewise, if the second cell $310_1$ is deemed to be in need for programming, it uses the remaining available power output of the power source 330 to perform the cell programming operation. Accordingly, the associated subtractor $360_1$ subtracts a value 1 from the remaining available bit number $N_1$ (in this case, $N_1$−1=1) and passes this information to the subsequent cell $310_2$.

If a received remaining available bit number ($N_i$) by a particular cell (e.g., $310_i$) indicates the value of 0 at a particularly time, it represents that there are $N_0$ preceding cells still under programming, therefore no additional output power is available at the particular moment. Accordingly, the particular cell (e.g., $310_i$) would have to wait for at least one of the preceding cells to terminate programming operation (either through the write-detection indication or by time-out indication), thereby freeing up available output power for the programming operations thereof.

Generally, when a memory cell is deemed to be in need of programming, and the corresponding remaining available bit number received from a previous cell ($N_{i-1}$) is greater than or equal to 1, the system may trigger a programming operation in that particular memory cell $310_i$. In addition, the remaining available bit number for a subsequent memory cell $310_{i+1}$ may be expressed as follows: $N_{i+1}$=max{$N_{i-1}$−1, 0}, where $N_{i+1}$ is the remaining available bit number sent to the next memory cell $310_{i+1}$, $N_{i-1}$ is the available bit number received from the previous memory cell $310_{i-1}$, and $N_i$=$N_{i-1}$−1 for a memory cell under programming. An associated subtractor (e.g., subtractor $360_i$) is employed to generate an updated remaining available bit number ($N_{i+1}$) indicative of a remaining available program current budget of a programming pulse from the power source 330 for a subsequent cell (e.g., cell $310_{i+1}$) during the programming operation of the memory cell $310_i$. Moreover, depending on the write detection result (e.g., whether a memory cell is still under programming or not), the system may send the program current budget information to a subsequent memory cell (e.g., cell $310_{i+1}$) indicating a remaining number of bits can be programmed, thereby enabling the dynamic triggering of a programming operation of a next memory cell. Accordingly, the exemplary memory system uses an operation status result (of a memory cell) obtained by the write detection unit 320 to dynamically trigger the programming operation of a next memory cell, thereby increasing programming throughput by saving time on the fast responding bits.

Figure 4:
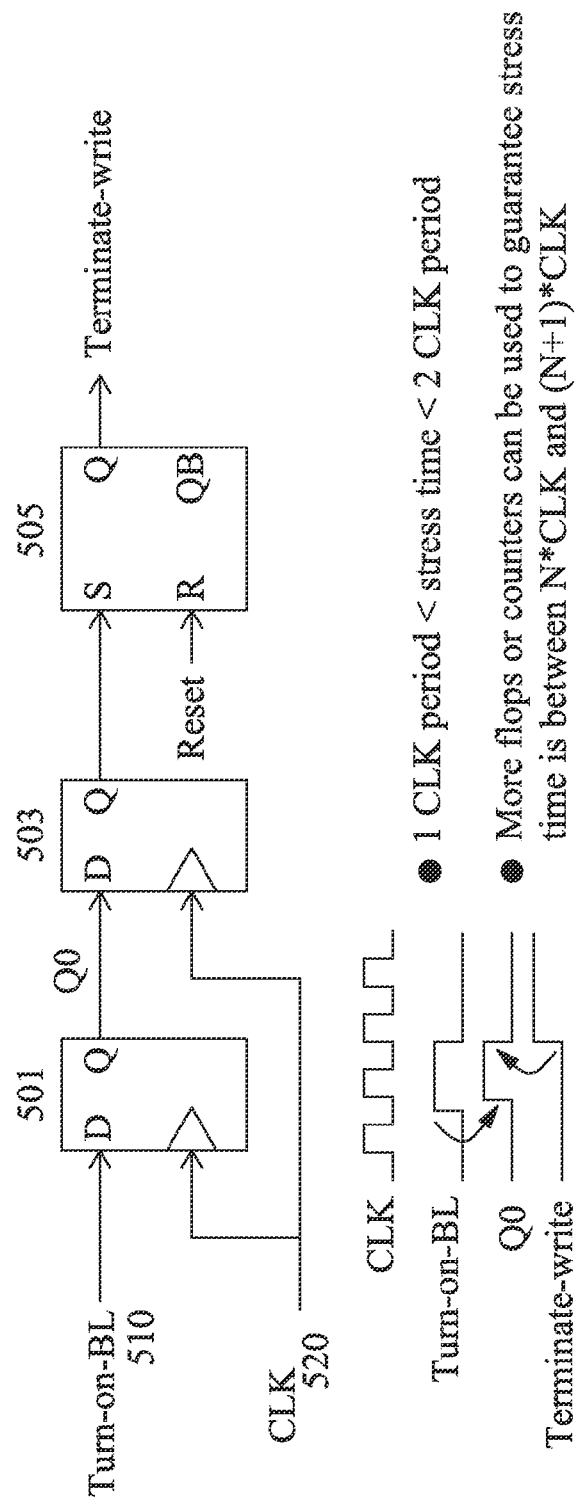
FIG. 4 illustrates an operation of a time-out unit in accordance with some embodiments of the instant disclosure.

Referring to FIG. 4, which illustrates an operation of a time-out unit in accordance with some embodiments of the instant disclosure. The time-out unit (e.g., time-out unit 350) may be a circuit comprising a few shift-registers configured to receive a clock source (e.g., CLK 520). As shown in FIG. 4, the exemplary time-out unit may include a combination of delay (D-type) flip flop (e.g., 501/503) and set-reset (SR-type) flip flop (e.g., 505) counters. The memory cell programming operation (e.g., the turn-on-BL instruction 510) may be terminated when a particularly time period is reached. In some embodiments, the termination time period (which corresponds to a memory cell programming/stress time) may be set to be greater than 1 clock cycle yet less than 2 clock cycles. Moreover, in some embodiments, more flip flop counters may be used to guarantee the stress time is kept between N*CLK and (N+1)*CLK. Accordingly, the system may utilize the time-out unit to terminate a programming operation to a slow-reacting/faulty memory cell to maintain overall operational efficiency and prevent over-stressing damage to that particular memory cell.

Figure 5:
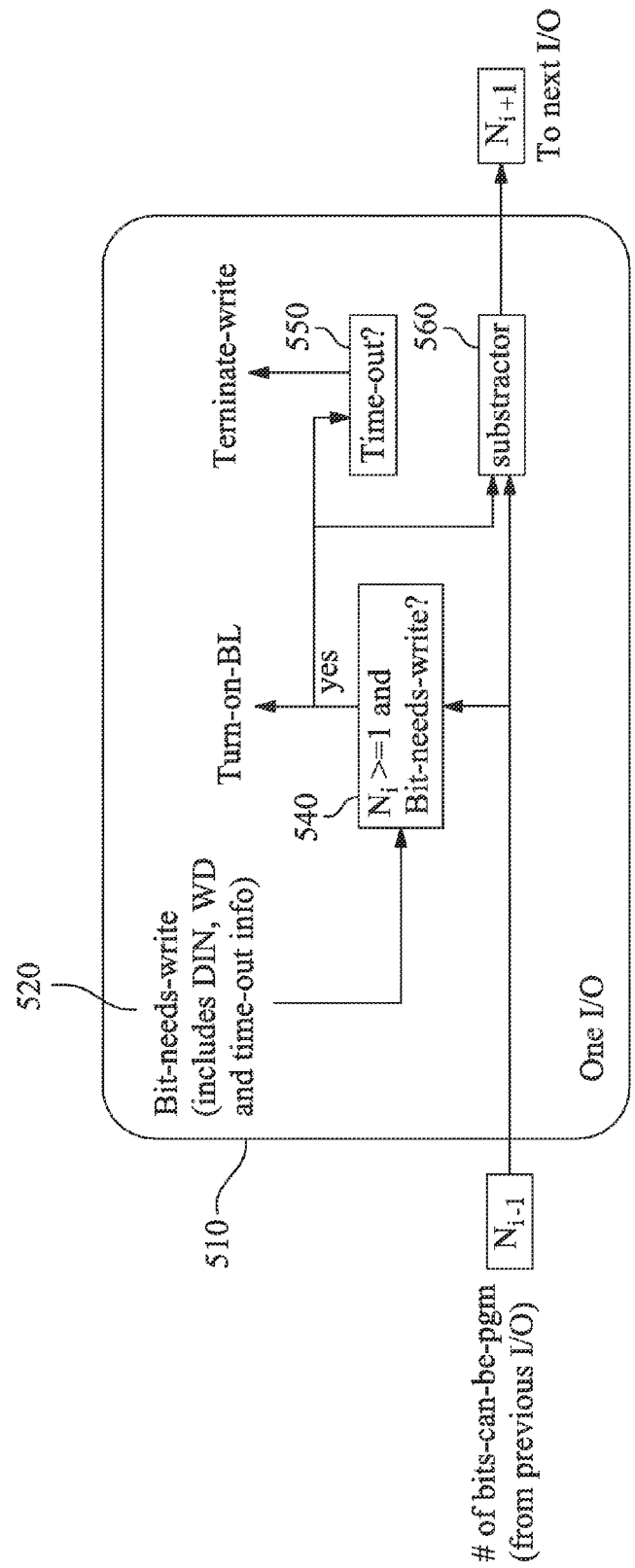
FIG. 5 illustrates a memory cell programming operation in accordance with some embodiments of the instant disclosure.

Referring to FIG. 5, which illustrates a memory cell programming operation in accordance with some embodiments of the instant disclosure. For a memory cell (e.g., memory cell 510), the system determines whether a memory cell requires programming (e.g., by a memory controller such as controller 340) and an operation status thereof (e.g., according to a write detection indication/time-out indication 520). Also, the memory cell 510 receives a remaining available bit number ($N_{i-1}$) (e.g., the remaining number of bits can be programmed) from a previous memory cell. When a memory cell is deemed to be in need of programming, and the remaining available bit number received from the previous cell ($N_{i-1}$) is equal to or greater than 1, the system triggers a programming operation on the particular memory cell by turning on the corresponding bit-line (e.g., indication 540). In addition, a corresponding subtractor (e.g., subtractor 560) is employed to generate a subsequent remaining available bit number ($N_{1+1}$) indicative of a remaining available program current budget of a programming pulse from a power source (e.g., power source 330 of FIG. 3). Moreover, a time-out unit is employed to provide a time-out indication (e.g., indication 550) upon the lapse of a predetermined time period, so that the system may terminate a programming operation to a particular memory cell to maintain operational efficiency and prevent over-stressing of a memory cell.

The processed/updated program current budget information (i.e., the remaining available bit number ($N_{1+1}$)) is directed to a next memory cell, and the process is repeatedly performed until the remaining memory cells complete their respective programming operations. As all the programming operations of all the memory cells in the group are completed/terminated, no more memory cell associated subtractor would perform subtraction operate on the programming output of the power source (e.g., power source 330), therefore the system returns a remaining available bit number of the original value $N_0$. Accordingly, the condition that the remaining available number ($N_i$) being equal to the concurrent-programmable bit number ($N_0$) indicates the completion of the cell programming process, and a write-verify operation may then be provided.

Figure 6:
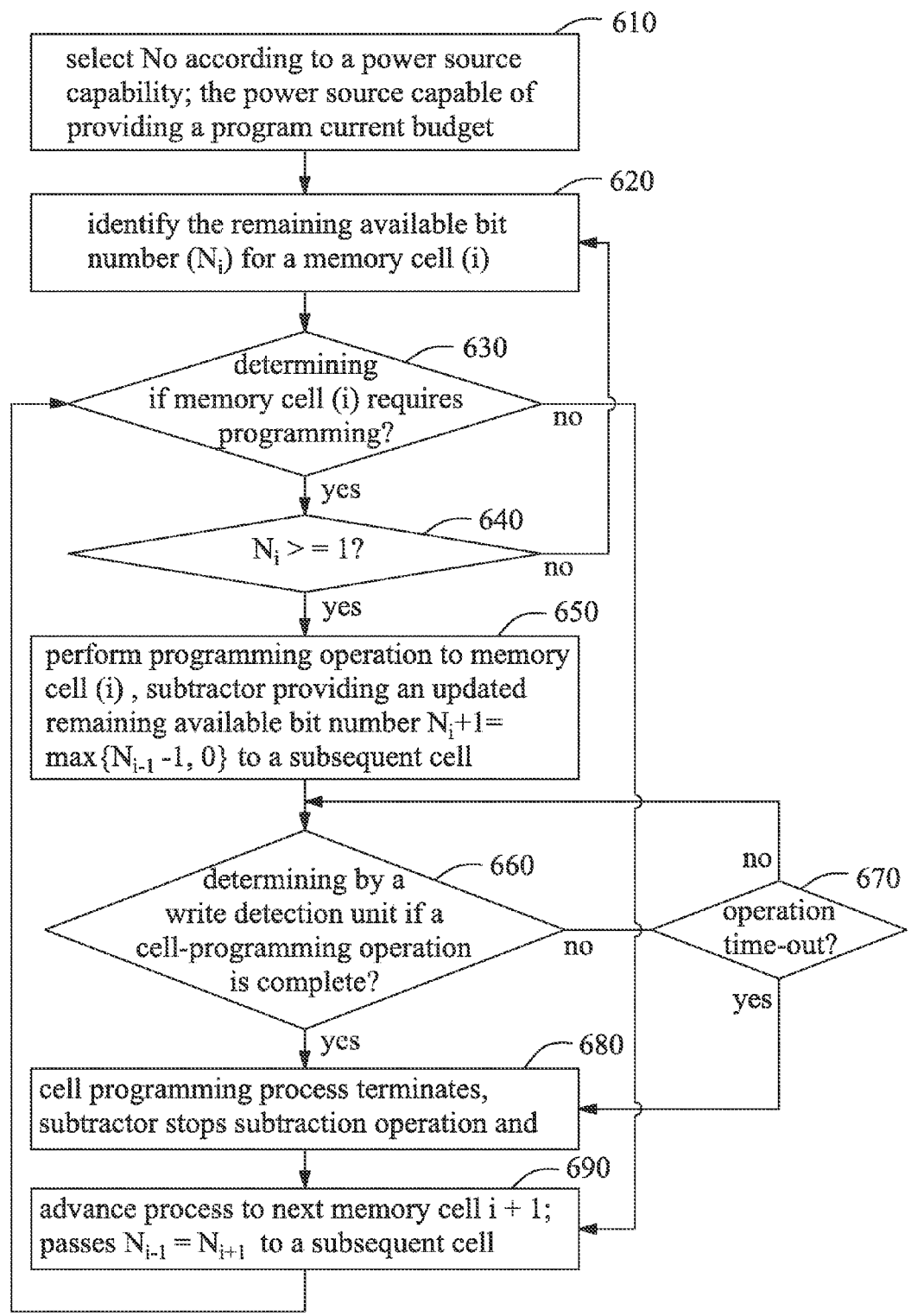
FIG. 6 shows an operation flow chart of a memory cell programming process in accordance with some embodiments of the instant disclosure.

Referring to FIG. 6, which shows an operation flow chart of a memory cell programming process in accordance with some embodiments of the instant disclosure. Specifically, the dynamic programming operation in accordance with the instant disclosure comprises a process 610 where a concurrent-programmable bit number ($N_0$) is determined. The concurrent-programmable bit number ($N_0$) may be determined in accordance with a power source capability of a memory system, and may correspond to a program current budget provided by the power source. The concurrent-programmable bit number ($N_O$) typically comprises a positive integer greater than 1 (or at the very least, equal to 1).

The programming operation advances to process 620, where a remaining available bit number ($N_i$) for an i-th memory cell is identified. Specifically, as the output of a power source is typically limited, available power of the programming output is sequentially reduced by the programming operations of the previous memory cells. The concurrent-programmable bit number ($N_O$) may be processed by a subtractor (e.g., 360$_i$) associated with a respective memory cell.

The power source is configured to sponsor the programming operations of $N_O$ numbers of memory cells in need of programming at a time. Each of the subtractors 360$_i$ associated with a memory cell under programming subtracts a value 1 from the concurrent-programmable bit number ($N_O$), resulting in a remaining available bit number $N_{i+1} = \max\{N_{i-1}-1, 0\}$, where $N_{i+1}$ is the remaining available bit number sent to the next memory cell (i.e., cell 310$_{i+1}$), and $N_{i-1}$ is the available bit number received from the previous memory cell (e.g., cell 310$_{i-1}$). The subtraction operation on the concurrent-programmable bit number ($N_O$) thus provides an indication of a remaining available bit number ($N_i$) of the program current budget corresponding to the programming output. If a received remaining available bit number (e.g., $N_{i-1}$ received from a previous memory cell (i−1)) is 0, it indicates that all preceding $N_O$ cells are still under programming, therefore no additional output power is currently available. Therefore, the particular memory cell (e.g., cell (i)) would have to wait for at least one of the preceding cell to terminate programming operation (either through the indication of write-detection or by time-out). As programming operation of one or more preceding cell is terminated, the respective subtractor stops performing subtraction operation on the remaining available bit number ($N_i$), thereby freeing up the available bit number (e.g., yielding $N_{i+1} \geq 1$) for a subsequent memory cell in need of programming.

The programming operation advances to process 630. Specifically, as a programming output provided by the power source is directed to the memory cells (e.g., a memory cell (i)), the process identifies whether or not the particular memory cell (i) requires programming. If the particular memory cell does not require a programming action, the process advances to a next memory cell (i+1) (e.g., referring ahead to process 690).

If the memory cell (i) is identified as being in need of programming, the programming operation advances to process 640, where the sufficiency of the remaining available bit number ($N_i$) received from a previous memory cell is determined. Moreover, the remaining available bit number may be re-determined/updated accordingly for the process of the next memory cell (i+1) (e.g., the operation returns to process 620).

If a memory cell is deemed to be in need of programming (e.g., process 630), and the remaining available bit number ($N_i$) received from a previous memory cell is sufficient (e.g., process 640), the programming operation proceeds to process 650 and triggers a programming operation on the particular memory cell (i) by turning on the corresponding bit-line. Moreover, the associated subtractor (e.g., 360$_i$) of the particular memory cell (i) provides an updated remaining available bit number $N_{i+1} = \max\{N_{i-1}-1, 0\}$ for a subsequent memory cell during the programming operation thereof.

As a cell programming operation is carried out on the particular memory cell (i), a write-detection unit is employed in process 660 to detect an programming operation status of the memory cell being programmed, and correspondingly generates a program completion indication to signal the completion of the programming operation.

In addition, a time-out unit is employed in the exemplary embodiment to provide a time-out indication in process 670 to terminate a programming operation on a memory cell if the particular memory cell is not successfully programmed within a predetermined time period. For instance, if a programming operation to a particular memory cell is found to be dragging on for too long, the operation may terminate a programming action to the particular memory cell to maintain operational efficiency and prevent over-stressing damage thereto. Upon the termination of a programming operation on a memory cell (e.g., memory cell (i)), the operation may advance to a subsequent memory cell (e.g. memory cell (i+1)).

Responsive to the program completion indication, the programming operation proceeds to process 680, where the programming operation is terminated. Accordingly, the corresponding subtractor stops performing subtraction operation on the remaining available bit number ($N_i$) and frees up the available bit number for a subsequent memory cell in need of programming.

The information of the updated remaining available bit number (e.g., $N_{i+1}$) is then directed to a next memory cell (i+1) in process 690, and the programming operation triggers the programming operation of a subsequent one of the memory cells accordingly by recurring to process 630.

Figure 7:
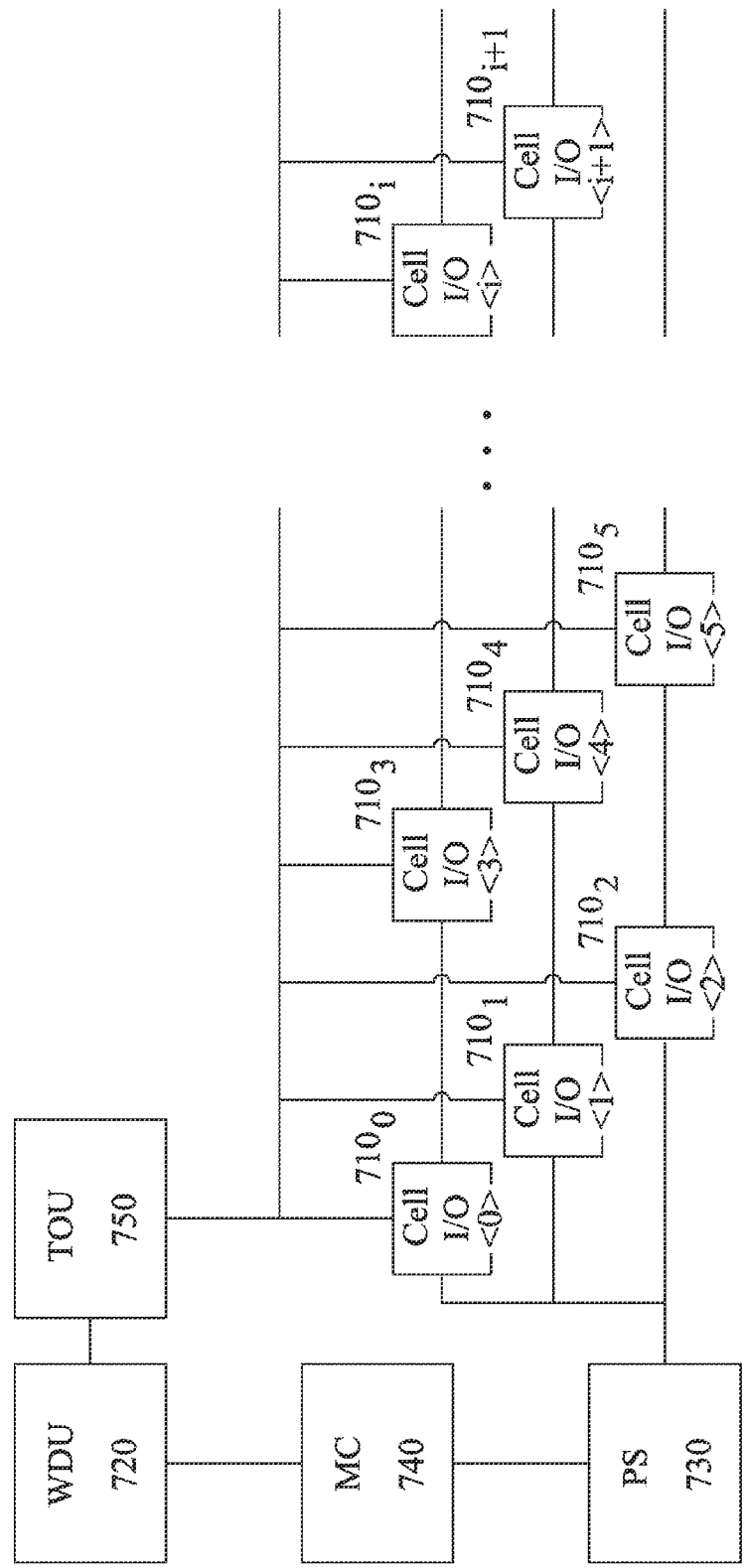
FIG. 7 shows a block diagram of a memory system in accordance with some embodiments of the instant disclosure.

Referring to FIG. 7, which shows a block diagram of a memory system in accordance with some embodiments of the instant disclosure. Specifically, the memory system of the instant example comprises a leaner arrangement that does not employ a cell-associated subtractor, which may enable further conservation of valuable area budget in a memory device.

Specifically, the memory system of the instant embodiment includes a plurality of memory cells (e.g., cells 710$_0$-710$_i$, etc., each having an I/O <0>-I/O <i>, respectively); a write detection unit (WDU) 720 in connection with the memory cells 710 and capable of detecting a programming operation status thereof; a power source (PS) 730 in connection with the memory cells 710$_0$-710$_i$ and capable of providing a memory cell programming signal to one or more memory cell 710$_0$-710$_i$; a time-out unit 750 configured to terminate a programming operation to a memory cell upon the lapse of a predetermined period of time; and a memory controller (MC) 740 in connection with the write detection unit 720, the power source 730, and the time-out unit 750, which is capable of controlling a memory access action of the memory cells 710$_0$-710$_i$.

The memory cell 710$_0$-710$_i$, the write detection unit 720, the power source 730, the memory controller 740, and the time-out unit 750 may be substantially identical to that depicted in the previous example, and therefore will not be further discussed for the brevity of disclosure.

However, the memory system of the instant exemplary embodiment employs a memory cell grouping arrangement, which divides the plurality of memory cells into a predetermined number ($N_O$) of cell sequences. Similarly, the predetermined number ($N_O$) may be selected in accordance with a physical capability limit of the of the power source 730. In the instant example, a cell sequence number 3 (i.e., $N_O$=3) is used for illustration. Particularly, the cell sequences include interleaving and non-consecutive memory cells. For example, as shown in FIG. 7, the plurality of memory cells 710 are grouped into three interleaving, non-consecutive memory cell sequences: a first sequence includes memory cells (I/O <0>), (I/O <3>), (I/O <6>), and so on; a second sequence includes memory cells (I/O <1>), (I/O <4>), (I/O <7>), and so on; and a third sequence includes memory cells (I/O <2>), (I/O <5>), (I/O <8>), and so on. Specifically, the number of cell sequence may be determined in accordance with a program current budget capability of the of the power source 730. Moreover, the predetermined number of cell sequence ($N_O$) typically comprises a positive integer not less than 1.

Figure 8:
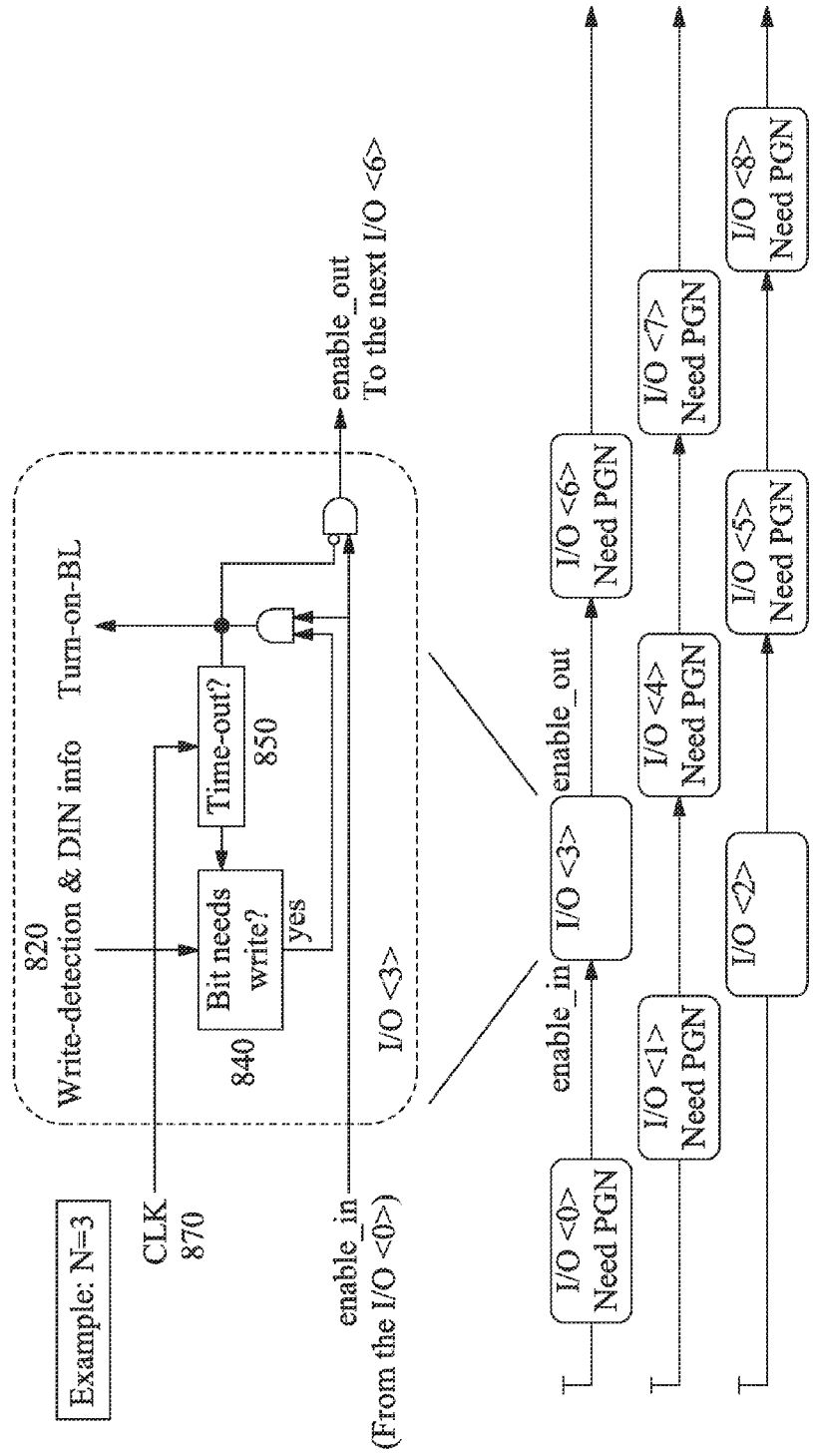
FIG. 8 illustrates a memory cell programming operation in accordance with some embodiments of the instant disclosure.

Referring to FIG. 8, which illustrates a memory cell programming operation in accordance with some embodiments of the instant disclosure. Particularly, instead of providing a programming output capable of concurrently programming $N_O$ numbers of memory cells, the power source in the instant embodiment (e.g., power source 730) provides an output sufficient for concurrently programming one memory cell to each of the respective $N_O$ cell sequences (in this example, $N_O=3$). In some embodiments, the provision of the programming output to each of the memory cell sequences may be substantially concurrent.

For a memory cell (e.g., I/O <3> of the first sequence), the system determines whether a memory cell requires programming (e.g., by a memory controller) and an operation status thereof (e.g., according to a write detection indication/time-out indication 820). Also, the memory cell (e.g., I/O <3>) receives a programming pulse from a previous memory cell in the sequence (e.g., I/O <0> of the first sequence). When a memory cell is deemed to be in need of programming, the system triggers a programming operation on the particular memory cell by turning on the corresponding bit-line (e.g., indication 840). In addition, a time-out unit is employed to provide a time-out indication (e.g., indication 850) upon the lapse of a predetermined time period, so that the system may terminate a programming operation to a particular memory cell to maintain operational efficiency and prevent overstressing of a memory cell.

Figure 9:
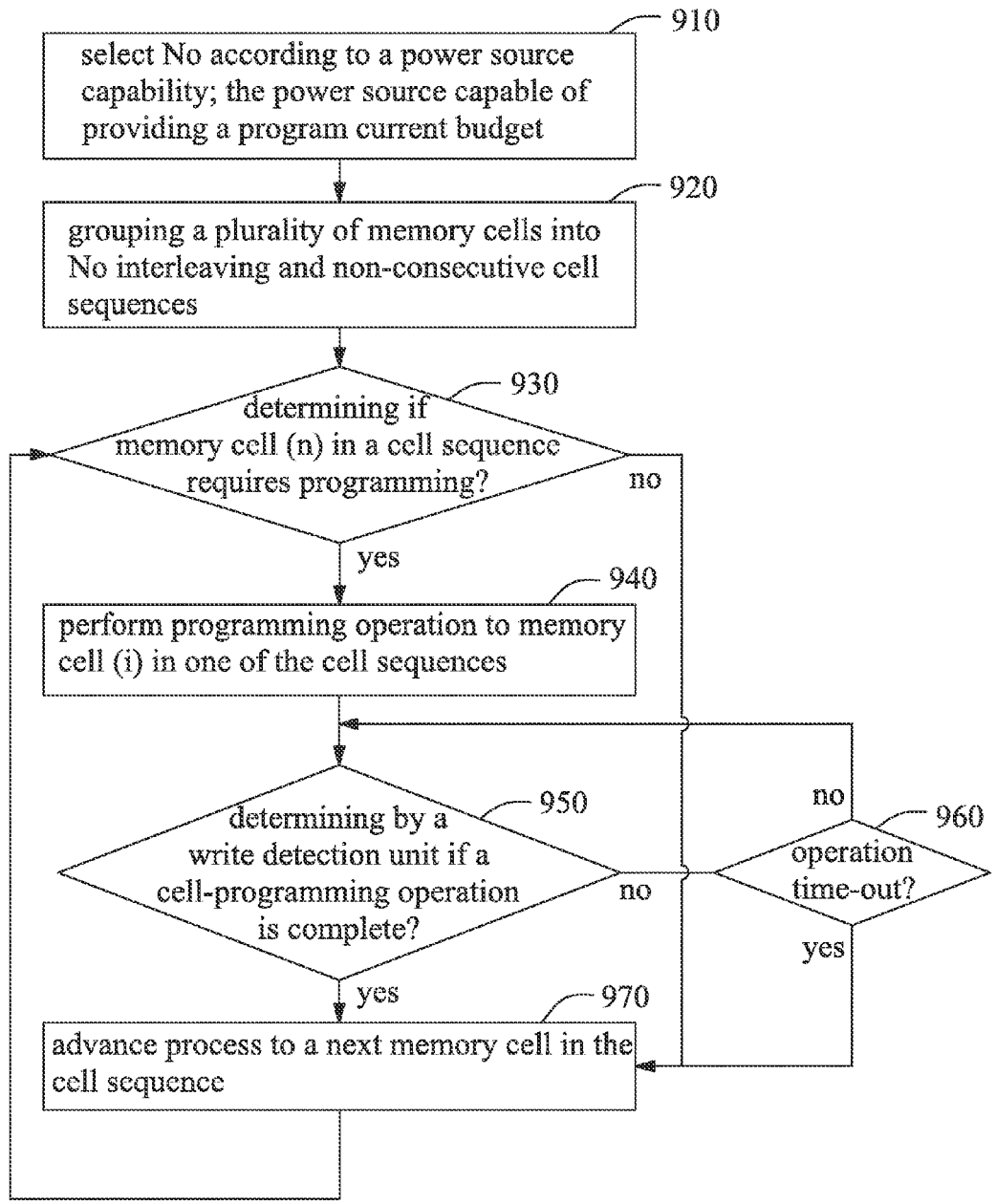
FIG. 9 shows an operation flow chart of a memory cell programming process in accordance with some embodiments of the instant disclosure.

Referring to FIG. 9, which shows an operation flow chart of a memory cell programming process in accordance with some embodiments of the instant disclosure. Specifically, the dynamic programming operation of the instant exemplary embodiment comprises a process 910 where a predetermined number of cell sequence ($N_O$) is determined. The predetermined number of cell sequence ($N_O$) may be determined in accordance with a power source capability of a memory system, and may correspond to a program current budget provided by the power source.

The programming operation advances to process 920, where a plurality of memory cells in the system is grouped into a predetermined number ($N_O$) of interleaving, non-consecutive cell sequences.

The programming operation advances to process 930. Specifically, as a programming output provided by the power source is directed to the memory cells (e.g., a memory cell (i)), the process identifies whether or not the particular memory cell (i) requires programming. If the particular memory cell does not require a programming action, the process advances to a next memory cell (i+1) (e.g., referring ahead to process 970).

If the memory cell (i) is identified as being in need of programming, the programming operation proceeds to process 940 and triggers a programming operation on the particular memory cell (i) by turning on the corresponding bit-line.

As a cell programming operation is carried out on the particular memory cell (i), a write-detection unit is employed in process 950 to detect an programming operation status of the memory cell being programmed, and correspondingly generates a program completion indication to signal the completion of the programming operation.

In addition, a time-out unit is employed in the exemplary embodiment to provide a time-out indication in process 960 to terminate a programming operation on a memory cell if of the programming operation of the particular memory cell is not completed within a predetermined time period and advance the operation to a next memory cell.

Responsive to the program completion indication, the programming operation proceeds to process 970, where the programming operation triggers the programming operation of a next memory cell in the same memory cell sequence.

Accordingly, one aspect of the instant disclosure provides a memory system, which comprises: a plurality of memory cells; a write-detection unit configured to detect a programming operation status of the memory cells being programmed, and correspondingly generating a program completion indication; and a memory controller configured to trigger programming operation to a subsequent one of the memory cells according to the program completion indication.

Accordingly, another aspect of the instant disclosure provides a dynamic programming method for a memory device, which comprises the processes of: (a) identifying, with a memory controller, a memory cell in a plurality of memory cells in need of programming; (b) performing programming operation on one of the memory cells in need of programming; (c) detecting, with a write-detection unit, an programming operation status of the memory cell being programmed, and correspondingly generating a program completion indication; and (d) triggering programming operation to a subsequent one of the memory cells according to the program completion indication from the write-detection unit.

Accordingly, one aspect of the instant disclosure provide a dynamic programming method for a memory device, which comprises the processes of: (a) grouping a plurality of memory cells into a predetermined number of cell sequences; (b) identifying, with a memory controller, a memory cell in one of the cell sequences in need of programming; (c) performing programming operation on a memory cell that requires writing in one of the cell sequences; (d) detecting, with a write-detection unit, an operation status of a memory cell being programmed, and correspondingly generating an program completion indication; and (e) triggering programming operation to a subsequent memory cell in the cell sequence according to the program completion indication from the write-detection unit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory system, comprising:
   a plurality of memory cells;
   a power source that is in connection with the memory cells and configured to provide a program current budget that corresponds to a capability of the power source;
   a write-detection unit in connection with the memory cells, configured to detect a programming operation status of the memory cells being programmed, and correspondingly generating a program completion indication; and
   a memory controller that is
      in connection with the power source and the write-detection unit,
      configured to trigger programming operation to a subsequent one of the memory cells according to the program completion indication, and
      configured to determine a concurrent-programmable bit number corresponding to the program current budget, and
   a subtractor coupled to a corresponding one of the memory cells, configured to process the concurrent-programmable bit number and produce a remaining available bit number corresponding to the program current budget during programming operation of the corresponding memory cell.

2. The memory system of claim 1, wherein the power source comprises a charge pump.

3. The memory system of claim 1, wherein the concurrent-programmable bit number comprises a positive integer not less than 1.

4. The memory system of claim 1, further comprising a time-out unit signal communicatively coupled to the memory controller, configured to terminate programming operation to a memory cell upon a predetermined period of time.

5. The memory system of claim 1, wherein the plurality of memory cells include non-volatile memory devices.

6. The memory system of claim 5, wherein the non-volatile memory devices include resistive type memory devices.

7. A dynamic programming method for a non-volatile memory device, comprising:
   identifying a memory cell in a plurality of memory cells in need of programming;
   performing a first programming operation on one of the memory cells in need of programming;
   detecting, with a write-detection unit, a programming operation status of the memory cell being programmed, and correspondingly generating a program completion indication;
   triggering a second programming operation to a subsequent one of the memory cells according to the program completion indication from the write-detection unit;
   determining a concurrent-programmable bit number that (i) corresponds to a program current budget and (ii) comprises a positive integer not less than 1; and
   processing the concurrent-programmable bit number to provide a remaining available bit number of the program current budget.

8. The method of claim 7, wherein the program current budget corresponds to a capability of a power source.

9. The method of claim 7, further comprising indicating a termination of programming process when the remaining available bit number equals to the concurrent-programmable bit number.

10. The method of claim 7, further comprising terminating programming operation to a memory cell upon a predetermined period of time.

11. The method of claim 7, further comprising:
    grouping the memory cells into a predetermined number of cell sequences, wherein the predetermined number corresponds to the program current budget.

12. The method of claim 11, wherein memory cells within each sequence are non-consecutive and are interleaved with memory cells of other sequences.

13. A method comprising:
    performing a first programming operation on one of the memory cells in need of programming;
    detecting a programming operation status of the memory cell being programmed, and correspondingly generating a program completion indication;
    triggering a second programming operation to a subsequent one of the memory cells according to the program completion indication from the write-detection unit;
    determining a concurrent programmable bit number that is derived from a program current budget that corresponds to a capability of a power source configured to power the memory cells; and
    processing the concurrent programmable bit number to provide a remaining available bit number of the program current budget.

14. The method of claim 13, wherein the processing is by decrementing the remaining available bit number.

15. The method of claim 13, further comprising:
    postponing the second programming operation if the remaining available bit number is zero.

16. The method of claim 13, further comprising:
    the power source providing the program current budget.

17. The method of claim 13, wherein the memory cells are non-volatile memory devices.

18. The method of claim 17, wherein the memory cells are resistive type memory devices.

19. The method of claim 13, further comprising:
    grouping the memory cells into a predetermined number of cell sequences, wherein the predetermined number corresponds to the program current budget.

20. The method of claim 19, wherein memory cells within each sequence are non-consecutive and are interleaved with memory cells of other sequences.

* * * * *